(12) United States Patent
Lano et al.

(10) Patent No.: US 6,574,253 B2
(45) Date of Patent: Jun. 3, 2003

(54) DEVICE FOR MONITORING THE EMISSION WAVELENGTH OF A LASER

(75) Inventors: Roberto Lano, Almese (IT); Franco Delpiano, Collegno (IT); Cristiana Contardi, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/095,236

(22) Filed: Mar. 11, 2002

(65) Prior Publication Data

US 2002/0163943 A1 Nov. 7, 2002

(30) Foreign Application Priority Data

May 2, 2001 (EP) .............................. 01304026

(51) Int. Cl.[7] ................................. H01S 3/13
(52) U.S. Cl. ................... 372/29.02; 372/32; 372/34; 372/20
(58) Field of Search ................. 372/32, 34, 20

(56) References Cited

U.S. PATENT DOCUMENTS

| | | | |
|---|---|---|---|
| 4,081,760 A | | 3/1978 | Berg ............................ 372/20 |
| 4,815,081 A | * | 3/1989 | Mahlein et al. ................ 372/32 |
| 5,781,572 A | | 7/1998 | Tahara et al. .................. 372/34 |
| 5,825,792 A | * | 10/1998 | Villeneuve et al. ............ 372/32 |
| 6,094,446 A | * | 7/2000 | Tei et al. ....................... 372/32 |
| 6,134,253 A | * | 10/2000 | Munks et al. .................. 372/32 |

FOREIGN PATENT DOCUMENTS

FR    2 788 605    7/2000

OTHER PUBLICATIONS

De Buyzer, H., Examiner. European Search Report, Application No. EP 01 30 4026, dated Sep. 10, 2001.

* cited by examiner

*Primary Examiner*—Quyen Leung

(57) ABSTRACT

A device for monitoring the emission wavelength of a laser includes a semiconductor slice or slab having first and second opposed surfaces. The semiconductor slice is exposed to the radiation at an angle such that a portion of said radiation impinges onto the first surface at angles in the vicinity of the Brewster angle for the first surface. The radiation is thus refracted into the semiconductor slice and caused to propagate towards the second surface of the semiconductor slice. A wavelength selective filter is arranged at said second surface having associated a photodetector to generate a signal indicative of the wavelength of the radiation.

23 Claims, 3 Drawing Sheets

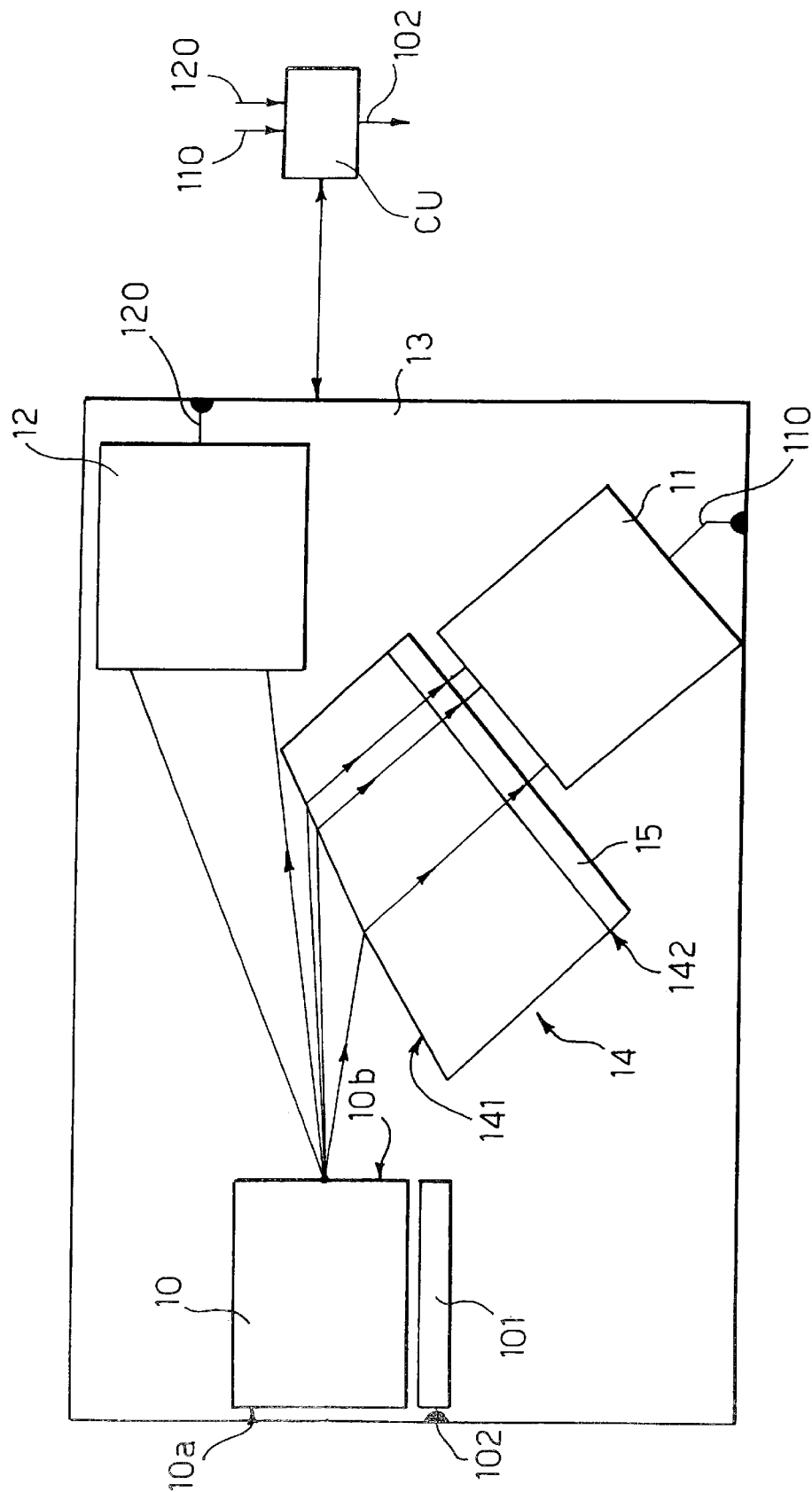

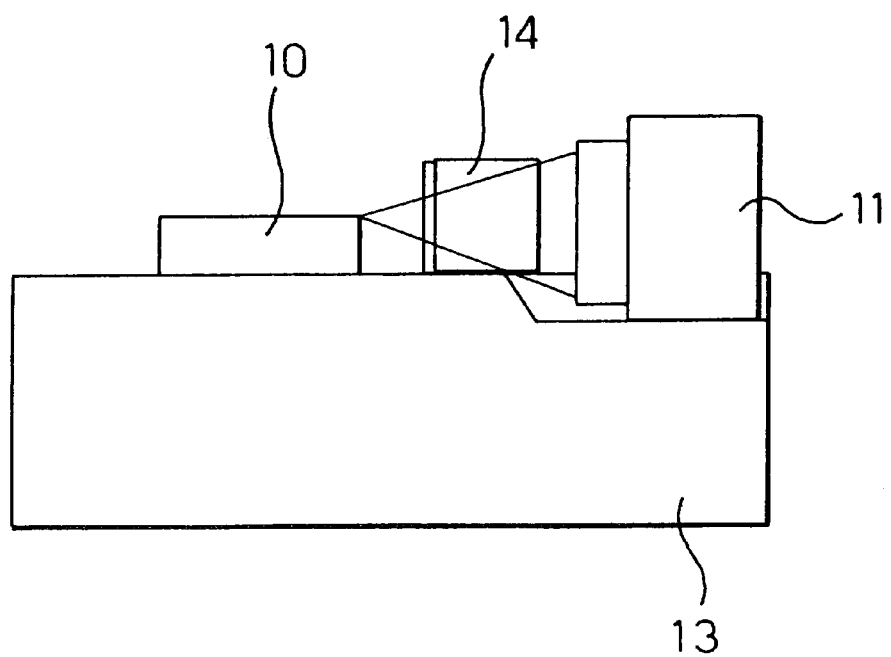
Fig_2

Fig_3
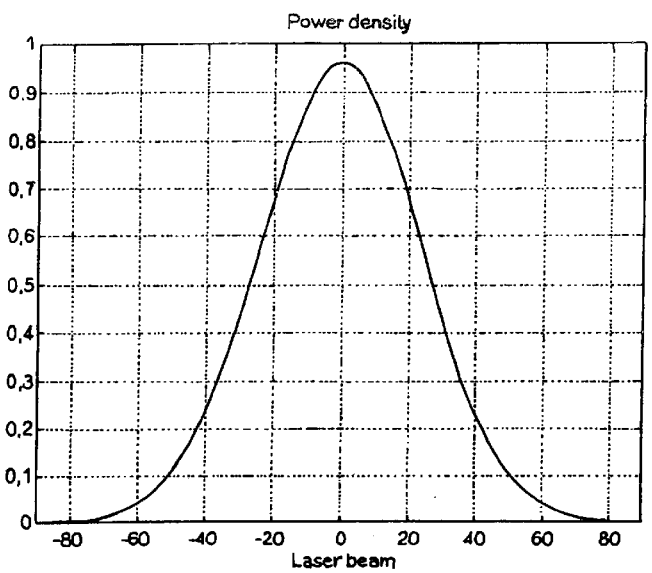
Fig_4
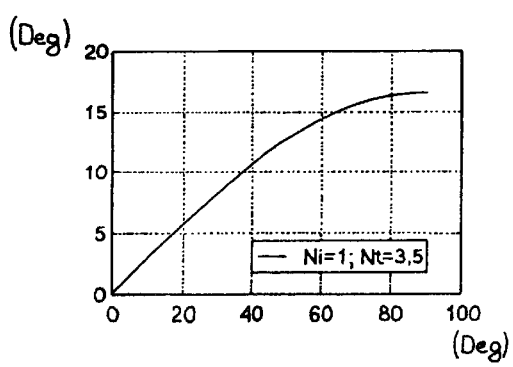
Fig_5
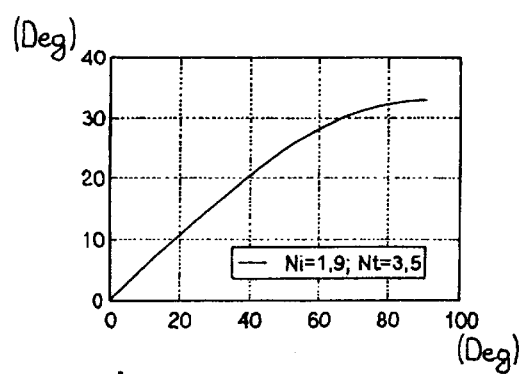
Fig_6
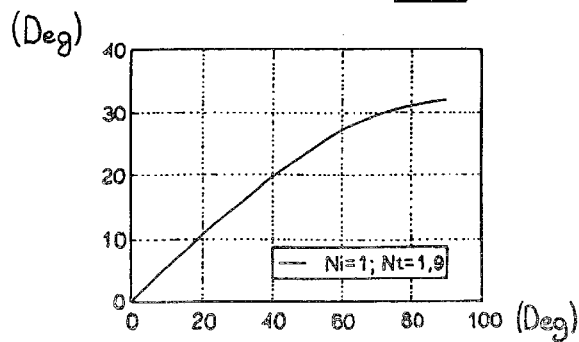

DEVICE FOR MONITORING THE EMISSION WAVELENGTH OF A LASER

BACKGROUND OF THE INVENTION

1. Field of the Invention

The invention relates to devices for monitoring the emission wavelength of a laser.

2. Discussion of the Background Art

Commercial WDM (Wavelength Division Multiplex) transmission systems, such as "dense" WDM (DWDM) systems provide high transmission capacity by using a channel spacing of 100–50 GHz. Real time wavelength monitoring and control is thus necessary in order to ensure the wavelength stability required for the optical source.

A number of arrangements adapted for that purpose are disclosed e.g. in U.S. Pat. No. 5,781,572, after which the preamble of claim 1 was patterned.

In addition to a laser emitting the radiation whose wavelength is to be controlled, such arrangements include at least one wavelength selective optical component, a device (such as a Peltier element) for controlling a temperature of the laser diode as well as a drive circuit for driving the Peltier element. The radiation from the laser (which is derived from the main radiation beam of the laser) is split over two paths. Wavelength selective optical components are arranged in at least one of the two optical paths. These components are optical filters having spectral characteristics whose transmittance continuously changes as a function of wavelength. Radiation passing through the optical filters is detected by means of photodetectors. The signal thus generated are used to drive the Peltier element.

A somehow similar arrangement is disclosed in EP-A-0 284 908 and the corresponding U.S. Pat. No. 4,815,081. There, an arrangement for controlling or regulating the emission wavelength and emitted optical power of a semiconductor laser is disclosed adapted for integrated optics implementation. In that arrangement, the laser, the filter device and first and second photodetectors (in the form of photodiodes) are integrated on a common substrate. The integrated filter device comprises one or more Bragg gratings, an optical directional coupler or an interference filter arranged in series in the directions of propagation of the conductor power. The optical powers which are conducted to the integrated filter device and to the first and second photodiodes are guided in each instance in an optical waveguide which is integrated on the substrate in the form of a strip waveguide.

In U.S. Pat. No. 6,094,446 an arrangement is disclosed wherein the light emitted by a laser diode is directed towards an interference optical filter. The light passing through the filter and the light reflected therefrom are detected by respective photodiodes.

Similarly, in the arrangement disclosed in U.S. Pat. No. 6,134,253, an optical filter is provided for receiving the laser radiation and for transmitting and reflecting first and second filtered beams respectively. The beams are filtered according to respective first and second spectral filter functions that cross at least one crossing wavelength. Varying the angle of incidence of the laser radiation upon the optical filter varies the spectral function thereof thus selecting or varying the operating wavelength of the laser.

Another arrangement of interest for the invention is disclosed in EP-A-0 818 859 (i.e. U.S. Pat. No. 5,825,792).

In order to manufacture a compact wavelength stabilised laser source a number of issues must be taken into account. For instance, the wavelength selective components must be operated under optimum or near-to-optimum conditions and, preferably, should be temperature controlled in order to avoid drift of their wavelength locking point with temperature.

In order to collect more power, the radiation to be detected must be generally collimated to give rise to a low-divergence beam by using a lens, possibly requiring active alignment as disclosed by K. Anderson in IEEE Electronic Component and Technology Conference, 1999, p. 197–200.

The requirements outlined in the foregoing may however result in arrangements which are overly complex and expensive to manufacture.

SUMMARY OF THE INVENTION

The object of the present invention is to provide an improved system overcoming the drawbacks of the prior art solutions considered in the foregoing, which is compact and adapted to be co-packaged within the same package with a laser emission source, by overcoming coupling, space and power dissipation problems, while also permitting feedback to the wavelength control to take place effectively over the full temperature operating range of the laser source.

According to the present invention that object is achieved by means of a device having the further features called for in the claims which follow.

Essentially, the arrangement of the invention consists of a wavelength monitoring system based on a wavelength selective element (typically an interference filter) for detecting an error signal and adapted for use in a control system using temperature feedback. The optical filter is deposited on a Si slice, placed on a Silicon Optical Bench (SiOB). The Si slice or slab preferably has a wedge shape and is arranged in a vertical position with the beam from the laser source impinging thereon under a high incidence angle. The slice position/orientation is determined in such a way to split the optical signal over two paths, which are collected by two photodetectors. One of these paths passes through the Si slice and the optical filter.

The high refractive index of Si (and the shape of the slice) collimate this beam thus optimising power transfer. Therefore, the incidence angle is determined in order to maximise the transmission at the air-Si and Si-air interfaces, working at the Brewster angle, whereby the incidence angle on the interference filter is almost constant and very close to 0° (normal incidence).

The SiOB platform is fully compatible with modern production processes, while allowing an efficient temperature control of the optical filter and simplifying mounting of the optical elements. Specifically, the arrangement of the invention is thoroughly compatible with the passive alignment process of the optical mount, thus implying lower costs.

BRIEF DESCRIPTION OF THE DRAWINGS

The invention will now be described, by way of example only, with reference to the annexed drawings, wherein:

FIG. 1 shows the general layout and arrangement of a device according to the invention, FIG. 2 is a schematic lateral view of the arrangement shown in FIG. 1, FIG. 3 shows a typical angular distribution of the power emitted by a laser source such as a laser diode, and FIGS. 4 to 6 are different diagrams showing Snell's law for various interfaces between a first medium and a second medium having different refractive indexes.

DETAILED DESCRIPTION OF THE INVENTION

In the arrangement of FIGS. 1 and 2 a laser source 10 such as a semiconductor laser is shown together with a first photodetector 11 and a second photodetector 12. Typically, photodetectors 11 and 12 are constituted by photodiodes which adapted to be integrated with the laser source 10 on a common silicon optical bench (SiOB) designated 13 overall.

Reference numeral 14 designates a silicon slice or slab also integrated on the optical bench or platform 13 and provided with first and second opposed surfaces, designated 141 and 142, respectively.

Surfaces 141 and 142 lie in planes which are generally orthogonal with respect to the general plane of optical bench 13. Stated otherwise, silicon slice or slab 14 is in a "vertical" position with respect to optical bench 13.

Surfaces 141 and 142 may be either parallel to each other or, preferably, angled to each other to form a dihedron. Thus slice or slab 14 has a tapered (i.e. wedge) shape overall with surfaces 141 and 142 converging towards each other with a given angle in the direction away from laser source 10.

The angle of taper shape of slice or slab 14 (i.e. the angle of the dihedron defined by the planes where surfaces 141 and 142 lie) plays a role in defining the propagation characteristics of radiation through slice 14 as better described in the following.

Surfaces 141 and 142 are located upstream and downstream of each other, respectively in the direction of propagation of radiation emitted from the laser source 10. Stated otherwise, radiation emitted by laser source 10 first impinges onto surface 141 to propagate then through slice 14 towards surface 142. Thus, the first surface 141 of slice 14 is be exposed to the radiation from laser 10 in the absence of any focusing means interposed in the propagation path of radiation between laser 10 and the first surface 141.

Such radiation is essentially comprised of "optical" or "light" radiation within the meaning currently allotted to those terms in fiber and integrated optics, namely radiation including, in addition to visible light, also infrared and ultraviolet radiation.

The radiation in question is included in a radiation lobe emitted form the back facet 10b of laser 10, a main radiation beam being emitted from a front surface or facet 10a of laser 10. Those skilled in the art will promptly appreciate that the device of the invention may be alternatively arranged to operate on optical radiation derived form the main radiation beam of laser 10 (e.g. by splitting out of the main radiation beam by means of a beam splitter of known type).

An optical wavelength-sensitive interference filter 15 is provided (in a known manner, e.g. by current interference filter glass technology) on surface 142 in order to be traversed by the optical radiation having propagated through slice or slab 14.

Operation of the arrangement of the invention essentially provides for the radiation emitted from the laser source 10 being directed partly on the first photodiode 11 (through wavelength-sensitive interference filter 15) and partly on the second photodiode 12 (this is usually by means of direct propagation in air).

At the output of photodiode 11, on a line 110 a signal is thus generated which is indicative of the wavelength of the radiation emitted by source 10. At the output of photodiode 12, on a line 120 another signal is generated which is indicative of the optical power associated with the radiation emitted by laser source 10.

The signals on lines 110 and 120 are thus adapted to be processed to produce a control signal to be applied on a line 102 to a temperature conditioning element such as a Peltier element 101 in order to control the temperature of laser source 10 to ensure that the wavelength thereof is kept constant.

The captioned processing is carried out in a known manner in a control unit generally designated CU. This may be either integrated on the same platform 13 of the device of the invention or arranged on a support such as a semiconductor chip located nearby. All of the foregoing takes places according to known principles and criteria thus making it unnecessary to provide a detailed description herein.

It will be appreciated however that mounting the various elements of the arrangement of the invention on the same optical bench 13 is advantageous in that element 101 may also ensure temperature control of slice or slab 14. Thus, the arrangement of the invention permits the wavelength emitted by laser source 10 to be stabilised with a degree of accuracy (in terms $GHz/°C$. thermal drift) which is essentially dictated by the temperature stability of interference filter 15.

The diagram of FIG. 3 shows a typical angular distribution of optical power density in the main radiation lobe emitted by a laser source such as source 10. Such a distribution may be essentially equated to a Gaussian distribution with values practically dropping to zero for angles lower that $-90°$ and higher than $90°$ with respect to the main central direction of propagation.

In the arrangement shown in FIG. 1, photodiode 12 and slice 14 are arranged in such a way to be exposed to radiation emitted from laser source 10 and included in respective portions of the angular distribution thereof.

Typically, the location of photodiode 12 is chosen in such a way to ensure that a sufficient amount of power is collected in order to permit correct measurement of the optical power emitted by laser source 10.

This can be achieved e.g. by using an amount of power in the vicinity of 2% of such a power.

In tests performed by the applicant, the active surface of photodiode 12 was exposed to radiation in the lobe emitted by a laser source 10 and included (by referring to the angular power density distribution shown in FIG. 3) between $-6.8°$ and $-22.3°$, the power thus collected by the active surface of photodiode 12 being about 2.4% of the power emitted by laser source 10.

Conversely, the location and—more to the point—the orientation of slice 14 is chosen in such a way that radiation emitted from laser source 10 impinges onto surface 141 at angles in the vicinity the Brewster angle for the interface between air (e.g. the medium through which radiation propagates between source 10 and surface 41) and silicon (that is the material comprising slice or slab 14).

In the specific case of air (whose refractive index is essentially 1) and silicon (having a refractive index of 3.5) the value of such an angle is in the vicinity of $74°$ (specifically 74.0546 degrees).

Radiation from laser source 10 impinging onto surface 141 at angles in the vicinity of the Brewster angle means that such optical radiation is in fact "captured" by slice 14 and thus caused to propagate through slice or slab 14 towards surface 142, through interference filter 15 and on towards photodiode 11.

The diagrams of FIGS. 4 to 6 (Snell's law for different interfaces) give the relationship between the angles (referred to the normal direction to the interface considered) of the incoming or impinging radiation (x-axes) and the angles (again referred to the perpendicular direction to the interface) of the radiation transmitted (y-axes).

Specifically, the diagram of FIG. 4 refers to the interface between air (refractive index for the incoming radiation Ni=1) and silicon (refractive index for the transmitted radiation Nt=3.5).

The diagram of FIG. 5 shows the relationship in the case of an interface between glass (Ni=1.9) and silicon (Nt=3.5).

Finally, the diagram of FIG. 6 shows the relationship in the case of the interface between air (Ni=1) and glass (Nt=1.9).

It will be appreciated that the diagrams of FIGS. 4 to 6 also apply in a complementary manner by exchanging the x and y axes. Also it will be appreciated that glass (Ni or Nt=1.9) is the material currently used for manufacturing wavelength selective filters such as filter 15.

The diagram of FIG. 4 shows that the range of angular variation (i.e. the angular divergence) of the radiation from source 10 impinging onto surface 141 is significantly reduced once such radiation is "captured" by slice 14 and caused to propagate through it. Slice 14 thus gives rise to a sort of focussing effect of radiation.

Specifically, tests were carried out by the Applicant by using a first slice 14 having a 13° taper angle (i.e. opening angle of the wedge shape) as well as a second slice 14 having a 15° taper angle.

Slice 14 was arranged in such a way that surface 141 may collect radiation in the lobe emitted by source 10 included in the angular range between −9.9° and 2.6° in the diagram of FIG. 2.

Orienting the first slice (13° taper) with filter 15 (in practice surface 142) at an angle of 40° with respect to the main axis of beam propagation (0° in the diagram of FIG. 2) led to angles of incidence of radiation onto surface 141 between 69 and 52.1° (in practice 50°).

Conversely, arranging the second slice 14 (15° taper) with filter 15 (surface 142) at an angle of 34° with respect to the main direction of beam propagation (0° of diagram of FIG. 2) led to angles of incidence of radiation onto surface 141 between 73 (in practice 75) and 61°.

In both cases, the "divergence" of the radiation beam impinging onto filter 15 at surface 142 was significantly smaller.

Specifically, in the first case considered in the foregoing (13° taper slice with 40° filter slope) the angle of incidence of radiation on filter 15 was between 0.77 and 0.4° (referred to silicon) and between 2.7 and 1.4° (referred to air/output beam).

In the second case considered (15° taper slice 14 with 34° filter slope) the angle of incidence of radiation on filter 15 was between 0.86 and 0.54° (again referred to silicon) and between 3.0 and 1.9° (referred to air/output beam).

In both cases considered, the amount of power on photodiode 11 was 1.84% and 1.94%, respectively. The arrangements and results considered refer to the radiation emitted by source 10 being polarised in a direction parallel to the interfaces considered.

It will also be appreciated that the angles of incidence onto filter 15 given in the foregoing, in addition to having a range of variation which is much smaller than the range of variation of the angles of incidence of radiation onto surface 141, are all in the close vicinity of 0°, which means that optical radiation impinges onto filter 15 in a direction substantially orthogonal thereto, that is under optimum operating conditions for such a filter.

Further tests carried out by the Applicant show that the arrangement of the invention is highly insensitive to any tolerances in the respective arrangement of laser source 10 and slice or slab 14. This applies both to the distance between laser 10 and slice or slab 14 and to variations in the angle between surface 141 and the main direction of propagation of radiation emitted by laser source 10.

In a particularly preferred embodiment, the distance between laser source 10 and photodiode 11 (with slab or slice 14 arranged therebetween) is around 800 micrometers. The distance between laser source 10 and photodiode 12 (with no elements interposed therebetween) is about 700 micrometers.

Naturally, the principle of the invention remaining the same, the details of construction and the embodiments of the invention may widely vary with respect to what has been described and illustrated purely by way of example, without departing from the scope of the present invention. For instance, surface 141 may be configured in such a way to be slightly convex in order to give rise to an additional focusing action on radiation which is propagated through slice or slab 14.

Also, any range or device value given herein may be extended or altered without losing the effects sought, as will be apparent to the skilled person for an understanding of the teachings herein.

What is claimed is:

1. A device for monitoring the emission wavelength of a laser emitting a lobe of radiation about a main emission axis, the device including a wavelength selective filter exposed to said radiation to generate an output signal indicative of the wavelength of said radiation, wherein the device includes a semiconductor slice having first and second opposed surfaces, said first surface being adapted to be exposed to said radiation at an angle to said main emission axis such that a portion of said radiation impinges onto said first surface at angles in the vicinity of the Brewster angle for said first surface to be refracted into said semiconductor slice towards said second surface, wherein said wavelength selective filter is arranged at said second surface.

2. The device of claim 1, wherein said first and second opposed surfaces are substantially parallel to each other.

3. The device of claim 2, wherein said semiconductor slice is adapted to be oriented with respect to said main emission axes in such a way that said portion of radiation is refracted towards said second surface substantially orthogonal thereto.

4. The device of claim 1, wherein said first and second opposed surfaces are at an angle with respect to each other whereby said semiconductor slice has a generally tapered, wedge-like form having a respective opening angle.

5. The device of claim 4, wherein said opening angle is selected in such a way that said portion of radiation is refracted towards said second surface substantially orthogonal thereto.

6. The device of claim 4, wherein said opening angle of said wedge-shaped semiconductor slice is in the range of about 13–15°.

7. The device of claim 1, wherein said first surface of the said semiconductor slice is adapted to be exposed to the radiation of said laser in the absence of any focusing means interposed in the propagation path of said radiation between said laser and said first surface.

8. The device of claim 1, wherein the semiconductor of said slice has a refractive index higher than 1.

9. The device of claim 8, wherein the semiconductor of said slice has a refractive index of about 3.5.

10. The device of claim 1, wherein the semiconductor of said slice is silicon.

11. The device of claim 1, wherein said semiconductor slice is arranged with said first surface in such a way that such radiation impinges onto said first surface at angles approximately between 50 and 75°.

12. The device of claim 1, wherein said radiation is propagated between said laser and said first surface in a medium having a refractive index of approximately 1.

13. The device of claim 1, wherein said radiation is propagated between said laser and said first surface in air.

14. The device of claim 1, wherein said radiation in said lobe is polarised in a given direction and said first surface of said semiconductor slice extends in said given direction.

15. The device of claim 1, wherein the radiation of said lobe is generated from the back facet of a laser.

16. The device of claim 1, further comprising an optically sensitive element adapted for generating a further signal indicative of the intensity of the radiation impinging thereon, said first surface of said semiconductor slice and said optically sensitive element being adapted to be exposed to said radiation in angularly adjacent regions of said lobe, whereby the radiation of said lobe impinges partly onto said semiconductor slice and partly onto said sensitive element.

17. The device of claim 16, further comprising a temperature-conditioning element adapted to be controlled on the basis of the output signals of said optically sensitive element and said respective optically sensitive element to temperature stabilise the wavelength of said laser.

18. The device of claim 17, wherein said semiconductor slice is exposed to the action of said temperature-conditioning element, whereby the temperature stability of said laser is primarily dictated by the temperature stability of said semiconductor slice.

19. The device of claim 17, wherein said temperature-conditioning element is a Peltier element.

20. The device of claim 1, wherein said wavelength selective filter has associated therewith a respective optically sensitive element adapted to generate said output signal indicative of the wavelength of said radiation.

21. The device of claim 1, wherein said device is integrated with said laser on a common platform.

22. The device of claim 21, wherein said common platform is an optical bench.

23. The device of claim 22, wherein said optical bench is a silicon optical bench.

* * * * *